(12) United States Patent
Eristoff et al.

(10) Patent No.: US 7,446,386 B2
(45) Date of Patent: Nov. 4, 2008

(54) OPTICAL COLOR SENSOR SYSTEM

(75) Inventors: Guy Eristoff, Singapore (SG); Kian Siong Ang, Singapore (SG); Sung Woon Choo, Singapore (SG); Hao Wang, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 479 days.

(21) Appl. No.: 11/250,324

(22) Filed: Oct. 15, 2005

(65) Prior Publication Data

US 2007/0085120 A1    Apr. 19, 2007

(51) Int. Cl.
*H01L 31/02* (2006.01)
*H01L 31/0232* (2006.01)

(52) U.S. Cl. ........... 257/440; 257/E31.11; 257/E31.121

(58) Field of Classification Search .................. 257/432, 257/433, 435, 440, E31.11, E31.121
See application file for complete search history.

(56) References Cited

U.S. PATENT DOCUMENTS

| 5,318,928 A | 6/1994 | Gegenwart et al. |
| 6,051,867 A | 4/2000 | Theil et al. |
| 6,369,417 B1 | 4/2002 | Lee |
| 6,632,700 B1 | 10/2003 | Fan et al. |

*Primary Examiner*—Evan Pert
(74) *Attorney, Agent, or Firm*—Mikio Ishimaru

(57) ABSTRACT

An optical color sensor system is provided including providing a substrate having an optical sensor therein and forming a passivation layer over the substrate. The passivation layer is planarized and color filters are formed over the passivation layer. A planar transparent layer is formed over the color filters and microlenses are formed on the planar transparent layer over the color filters.

8 Claims, 3 Drawing Sheets

OPTICAL COLOR SENSOR SYSTEM

TECHNICAL FIELD

The present invention relates generally to semiconductor systems, and more particularly to optical sensors.

BACKGROUND ART

Optical color sensors can be found in most of digital camera system. An incident light is transformed to an electronic signal. Then, the electronic signal is converted and digitized for an image process and recorded by an analog/digital converter.

Unfortunately, optical color sensors suffer from color image aberrations that distort the true color of the image. These aberrations can be caused by the non-uniformity of pixel-to-pixel color transmission resulting from the non-uniformity of color resist flow. Some of the present solutions are discussed below.

One solution is to apply a low viscosity color resist in a unique spin recipe onto a standard passivation surface and attempt to optimize the transmission matching through a photolithography coating process. This process has inherent drawbacks in that the topographical features of the surface of the incoming wafer limit the reduction of non-uniformity that can be achieved.

Another solution involves inserting a spin on the planarization layer between the passivation and the color filter layer. This process suffers from integration issues associated with the bondpad interface. The non-uniformity of the color filter layer is still on the order of about 200 Angstroms peak to trough.

Thus, a need still remains for a system for improving the uniformity of color transmission in optical color sensors. In view of the foregoing, it is increasingly critical that answers be found to these problems.

DISCLOSURE OF THE INVENTION

The present invention provides an optical color sensor system including providing a substrate having an optical sensor therein and forming a passivation layer over the substrate. The passivation layer is planarized and color filters are formed over the passivation layer. A planar transparent layer is formed over the color filters and microlenses are formed on the planar transparent layer over the color filters.

Certain embodiments of the invention have other advantages in addition to or in place of those mentioned or obvious from the above. The advantages will become apparent to those skilled in the art from a reading of the following detailed description when taken with reference to the accompanying drawings.

BEST MODE FOR CARRYING OUT THE INVENTION

Figure 1:
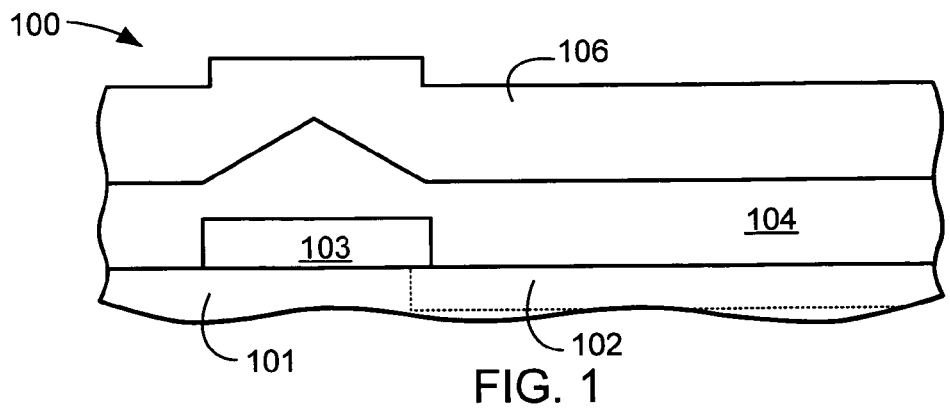
FIG. 1 is a cross-sectional view of an optical color sensor system in an intermediate step of manufacturing after a passivation and deposition step in accordance with an embodiment of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGs.

The term "horizontal" as used herein is defined as a plane parallel to the conventional plane or surface of a substrate, regardless of its orientation. The term "vertical" refers to a direction perpendicular to the horizontal as just defined. Terms, such as , "above", "below", "bottom", "top", "side" (as in "sidewall"), "higher", "lower", "upper", "over", and "under", are defined with respect to the horizontal plane. The term "on" refers to one element being in contact with another element.

The term "processing" as used herein includes deposition of material or photoresist, patterning, exposure, development, etching, cleaning, and/or removal of the material or photoresist as required in forming a described structure.

It has been found that, with new high end mobile camera phones, a yellow diagonal striation becomes apparent when a picture taken of a monochrome background is viewed on the phone screen. The source of problem has been difficult to determine because it does not occur on all phone screens.

After extensive investigation, it has been discovered that the problem is not with the phone screen but on the picture taking end. Even further investigation revealed that the problem was related to the optical sensors used to take each pixel of the picture.

However, it was found that the yellow striations would occur with some optical sensor systems but not with others. This led to the further discovery that the problem depends upon the location of the optical color sensor chips on a wafer and that the problem will affect a horrendous 40% to 50% of the chips on a given wafer.

After even further investigation, it was discovered that the problem is associated with color transmission uniformity through the microlenses that focus the light on to the optical sensors. It has subsequently been determined that microscopic unevenness of the color filters and lenses for each optical sensor cause the yellow striations.

It was finally discovered that the uniformity of the transmission of color is enhanced through active planarization of a passivation layer prior to application of color filters. The topographical features are eliminated prior to, and during the application of the color filters.

As further described in detail below various layers of transparent or semi-transparent material are deposited starting with a layer of encapsulating passivation material is applied over a top metal layer and then planarized through a process, such as chemical mechanical planarization (CMP), prior to application of the color filters. FIGS. 1-10 do not illustrate any non-essential color filter topography in non-pixel areas for purposes of clarity.

Referring now to FIG. 1, therein is shown a cross-sectional view of an optical color sensor system 100 in an intermediate step of manufacturing after a passivation and deposition step in accordance with an embodiment of the present invention. A substrate 101 contains the optical sensors 102 of the optical color sensor system 100.

A metal pad 103 is formed on the substrate 101 and is connected to the optical sensors. The metal pad 103 is surrounded and covered by a layer of encapsulating passivation material 104. FIG. 1 illustrates an example of the metal pad 103 having a thickness of about 6,000 Å. The layer of encapsulating passivation material 104 may include, for example, silicon dioxide or silicon nitride deposited by high density plasma (HDP) deposition. In accordance with one embodiment, the layer of encapsulating passivation material 104 is deposited to a thickness of about 12,000 Å.

A layer of top passivation material 106 is deposited by TEOS deposition on top of the layer of encapsulating passivation material 104. In accordance with one embodiment, the layer of top passivation material 106 has a thickness of about 12,000 Å.

Figure 2:
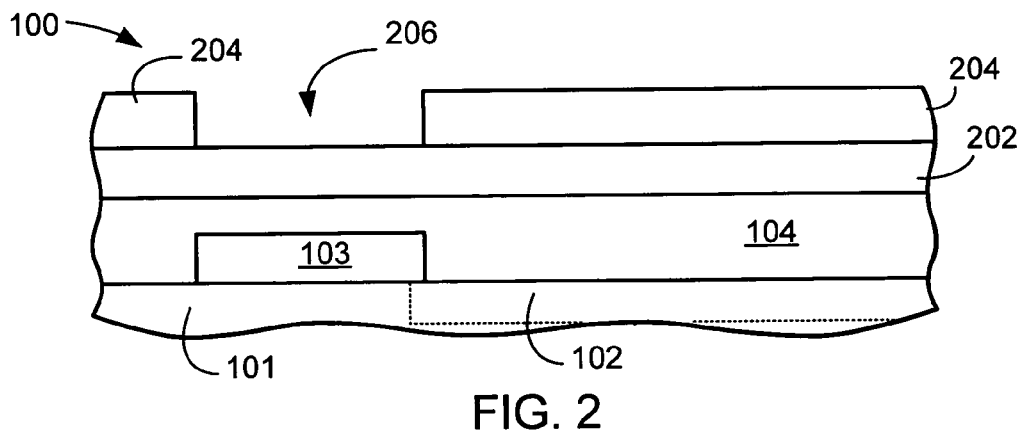
FIG. 2 is the structure of FIG. 1 in a polishing and passivation mask step in accordance with an embodiment of the present invention.

Referring now to FIG. 2, therein is shown the structure of FIG. 1 in a polishing and passivation mask step in accordance with an embodiment of the present invention. The previously deposited layer of top passivation material 106 is uniformly polished back along with a portion of the layer of encapsulating passivation material 104 until the top passivation material 106 is completely removed. This leaves a thickness of the layer of encapsulating passivation material 104 of uniform thickness above the substrate. The thickness is such that about 6,000 Å of material is left above the metal pad 103. A hard mask layer, such as nitride 202, is uniformly deposited on the layer of encapsulating passivation material 104.

FIG. 2 illustrates an example of the nitride 202 having a thickness of about 5,000 Å. A passivation mask 204 is subsequently deposited on the layer of nitride 202. The passivation mask 204 is processed to have an opening 206 leaving at least a portion of the top surface of the nitride 202 exposed over the metal pad 103 of FIG. 1. In accordance with one embodiment, the passivation mask 204 includes an L95 resist material (CHRT bondpad layer).

Figure 3:
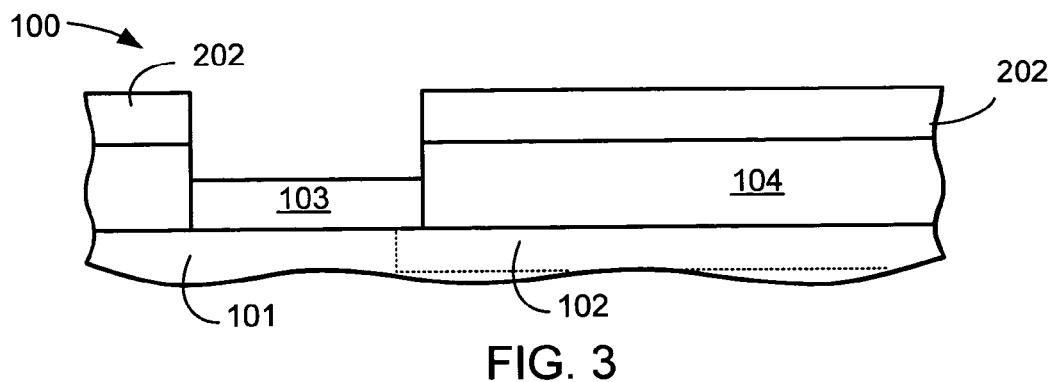
FIG. 3 is the structure of FIG. 2 in an etching and stripping step in accordance with an embodiment of the present invention.

Referring now to FIG. 3, therein is shown the structure of FIG. 2 after an etching and stripping step in accordance with an embodiment of the present invention. The passivation mask 204 is removed and an etching process using the nitride 202 as a hard mask removes an exposed portion of the layer of encapsulating passivation material 104 located above the metal pad 103 to expose the top surface of the metal pad 103.

Figure 4:
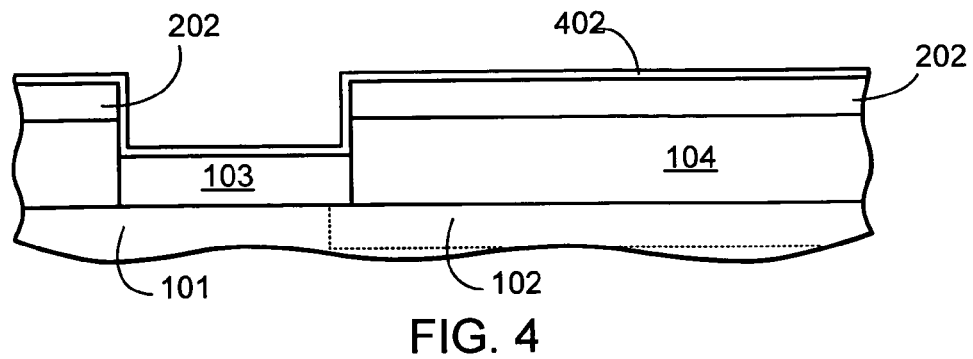
FIG. 4 is the structure of FIG. 3 in a coating step in accordance with an embodiment of the present invention.

Referring now to FIG. 4, therein is shown the structure of FIG. 3 in a coating step in accordance with an embodiment of the present invention. A coating layer 402 is deposited on the layer of nitride 202 and the top surface of the metal pad 103. For illustration purposes, the coating layer 402 may have a thickness of about 600 Å. The coating layer 402 may, for example, include anti-reflective coating materials.

Figure 5:
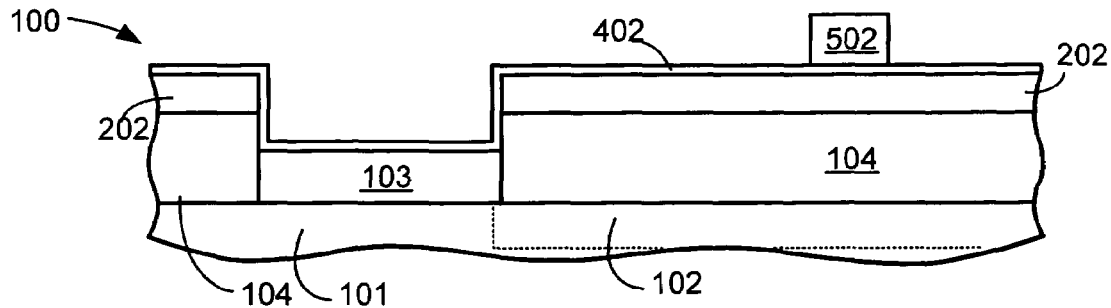
FIG. 5 is the structure of FIG. 4 in a deposition step of a red color filter in accordance with an embodiment of the present invention.

Referring now to FIG. 5, therein is shown the structure of FIG. 4 in a deposition step of a red color filter in accordance with an embodiment of the present invention. FIG. 5 illustrates a deposition step of a red color filter 502, such as, a red color mask. A red color filter 502 is deposited on a portion of the coating layer 402 that is supported by the layer of nitride 202. For illustration purposes, the red color filter 502 may have a thickness of about 1.0±0.2 μm.

It has been found that the order of deposition of the filters also makes a difference in solving the yellow striation problem. The sequence of red, blue, and the green filters was used originally but it has been discovered that green, red, and then blue filters provides a noticeable improvement.

Through experimentation, it was found that priming is required to prevent pixel peeling when the blue filter is deposited last. It has been discovered that deposition in the sequence of blue, red, and then green filters is not subject to pixel peeling while being comparable to green, red, and then blue filters.

Figure 6:
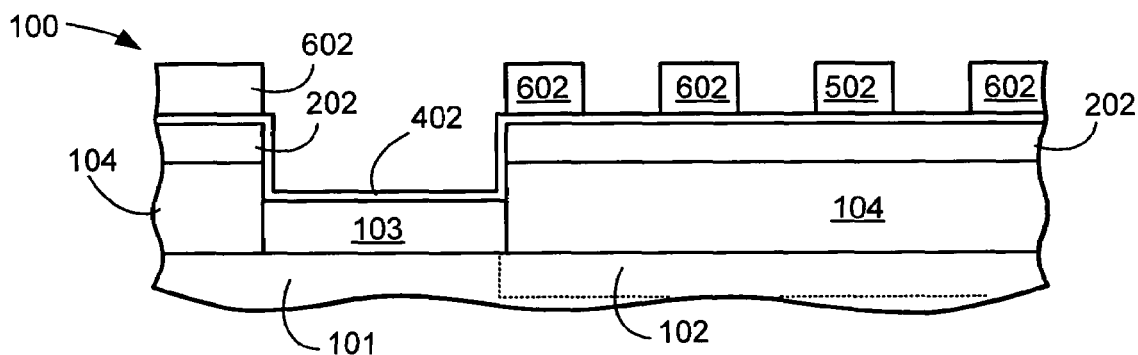
FIG. 6 is the structure of FIG. 5 in a deposition step of a blue color filter in accordance with an embodiment of the present invention.

Referring now to FIG. 6, therein is shown the structure of FIG. 5 in a deposition step of a blue color filter in accordance with an embodiment of the present invention. A blue color filter 602, such as, a blue color mask, is deposited on a portion of the coating layer 402 that is supported by the layer of nitride 202. For illustration purposes, the blue color filter 602 may have a thickness of about 1.0±0.2 μm.

Figure 7:
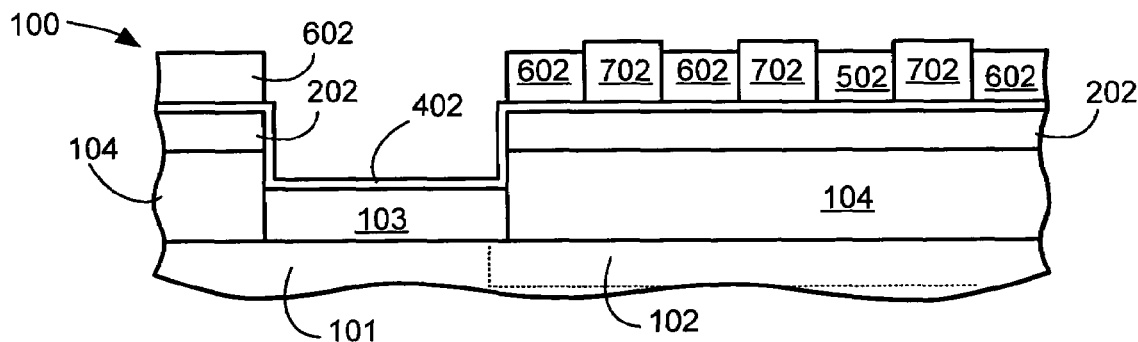
FIG. 7 is the structure of FIG. 6 in a deposition step of a green color filter in accordance with an embodiment of the present invention.

Referring now to FIG. 7, therein is shown the structure of FIG. 6 in a deposition step of a green color filter in accordance with an embodiment of the present invention. A green color filter 702 such as, a green color mask, is deposited on a portion of the coating layer 402 that is supported by the layer of nitride 202. FIG. 7 illustrates an example where the green color filter 702 is deposited adjacently to the blue color filter 602 and/or the red color filter 502. For illustration purposes, the green color filter 702 may have a thickness of about 1.1±0.2 μm.

Figure 8:
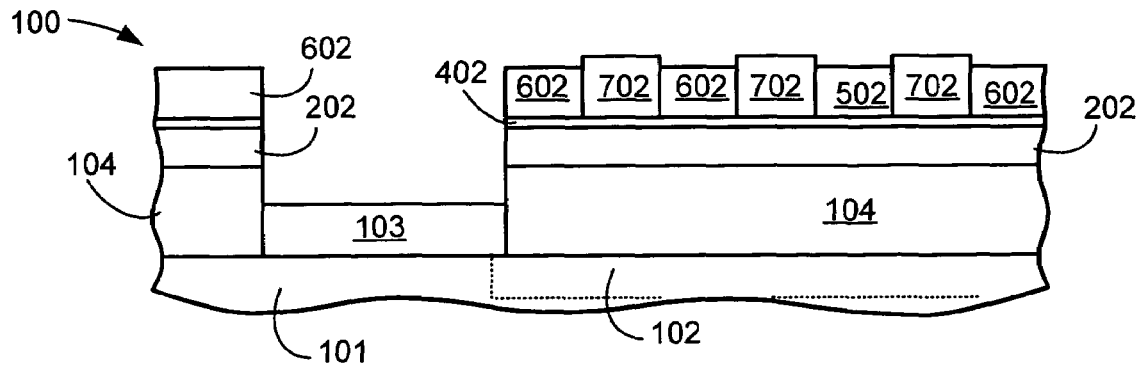
FIG. 8 is the structure of FIG. 7 in an etching step in accordance with an embodiment of the present invention.

Referring now to FIG. 8, therein is shown the structure of FIG. 7 in an etching step in accordance with an embodiment of the present invention. An exposed portion of the coating layer 402 located above adjacent the metal pad 103 is removed or etched away during the etching step. The etching process also removes a thickness of less than 1,000 Å from the red color filter 502, the blue color filter 602, and the green color filter 702.

Figure 9:
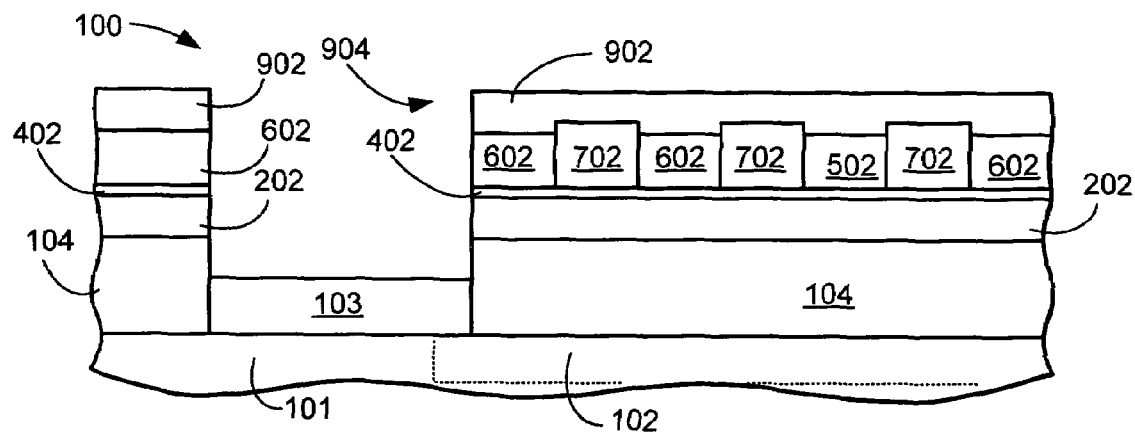
FIG. 9 is the structure of FIG. 8 in a planarization step in accordance with an embodiment of the present invention.

Referring now to FIG. 9, therein is shown the structure of FIG. 8 in a planarization step in accordance with an embodiment of the present invention. A layer of planar material 902 is uniformly deposited on the top surface of the red color filter 502, the blue color filter 602, and the green color filter 702 to form a planar top surface. In accordance with one embodiment, the planar transparent layer 902 has a thickness of about 0.95±0.2 μm.

Figure 10:
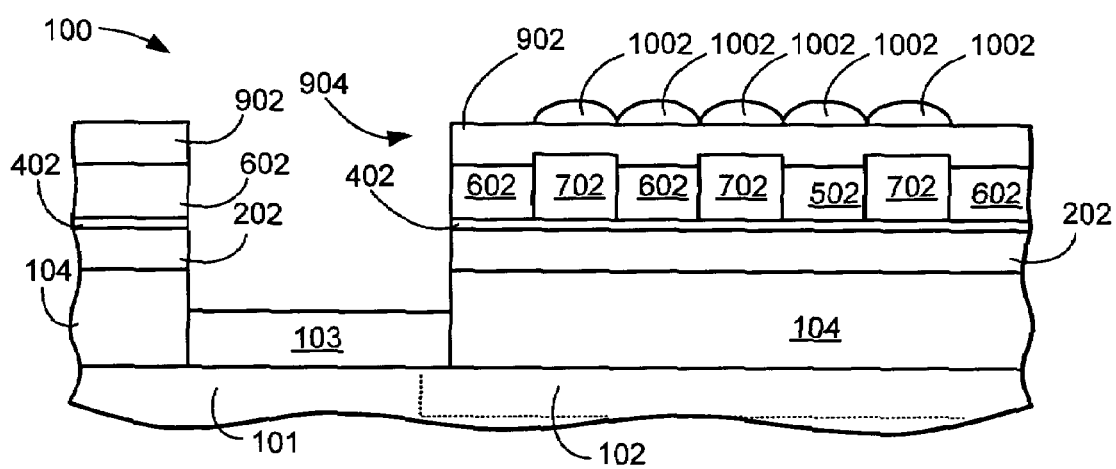
FIG. 10 is the structure of FIG. 9 in a formation step in accordance with an embodiment of the present invention.

Referring now to FIG. 10, therein is shown the structure of FIG. 9 in a formation step in accordance with an embodiment of the present invention. A microlens 1002 is formed on top of the planar transparent layer 902. FIG. 10 illustrates a plurality of microlenses 1002 where each microlens 1002 is adjacent to the red color filter 502, the blue color filter 602, and the green color filter 702. In accordance with one embodiment, each microlens 1002 has a thickness of about 1.0±0.1 μm. The space between each microlens 1002 may range from about 0.2 µm to about 0.5 µm. Each microlens 1002 may have a horizontal dimension ranging from about 5.3 µm to about 5.4 µm.

Figure 11:
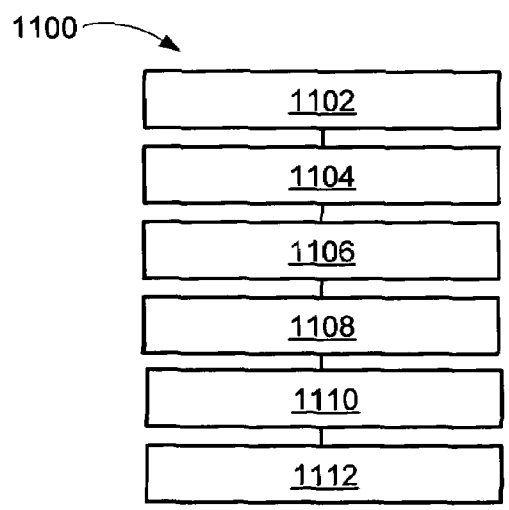
FIG. 11 is a flow chart of a optical color sensor system for fabricating a optical color sensor in accordance with an embodiment of the present invention.

Referring now to FIG. 11, therein is shown a flow chart of an optical color sensor system 1100 for manufacturing the optical color sensor system 100 in accordance with an embodiment of the present invention. The system 1100 includes providing a substrate having an optical sensor therein in a block 1102; forming a passivation layer over the substrate in a block 1104; planarizing the passivation layer in a block 1106; forming color filters over the passivation layer in a block 1108; forming a planar transparent layer over the color filters in a block 1110; and forming microlenses on the planar transparent layer over the color filters in a block 1112.

In greater detail, a system to optical sensor color transmission uniformity enhancement by active planarization of passivation, according to an embodiment of the present invention, is performed as follows:

1. providing the metal pad 103, encapsulating the metal pad 103 with the layer of encapsulating passivation material 104, and depositing the layer of top passivation material 106 on top of the layer of encapsulating passivation material 104. (FIG. 1)
2. polishing back the layer of top passivation material 106, depositing the layer of nitride 202 on the layer of encapsulating passivation material 104, depositing the passivation mask 204 on the layer of nitride 202. (FIG. 2)
3. etching the passivation mask 204 and the exposed portion of the layer of encapsulating passivation material 104. (FIG. 3)
4. depositing the coating layer 402 on the layer of nitride 202 and on the metal pad 103. (FIG. 4)
5. depositing the red color filter 502 on the coating layer 402. (FIG. 4)
6. depositing the blue color filter 602 on the coating layer 402. (FIG. 6)
7. depositing the green color filter 702 on the coating layer 402. (FIG. 7)
8. etching the exposed portion of the coating layer 402. (FIG. 8)
9. depositing the planar transparent layer 902 on the red color filter 502, the blue color filter 602, and the green color filter 702. (FIG. 9)
10. forming a microlens 1002 on the planar transparent layer 902. (FIG. 10)

It has been discovered that the present invention thus has numerous advantages.

An aspect is that by actively planarizing the semiconductor passivation surface prior to and during color filter resist dispense, topographically-induced flow non-uniformities are significantly reduced or eliminated. This leads to significantly enhanced pixel color transmission uniformity through a reduction in fluid mechanical resistance during color resist dispense. This color filter non-uniformity is on the order of about 20 Å peak to trough, (representing an order of magnitude reduction in non-uniformity over the prior schemes).

Yet another aspect of the present invention is that it valuably supports and services the historical trend of reducing costs, simplifying systems, and increasing performance.

These and other valuable aspects of the present invention consequently further the state of the technology to at least the next level.

The resulting processes and configurations are straightforward, cost-effective, uncomplicated, highly versatile and effective, can be implemented by adapting known technologies, and are thus readily suited for efficiently and economically manufacturing large die IC packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

The invention claimed is:

1. An optical color sensor system comprising:
a substrate;
an optical sensor in the substrate;
a metal pad on the substrate connected to the optical sensor;
a planarized passivation layer over the substrate, the passivation layer further comprises:
an encapsulating passivation layer, and
a hard mask layer on the encapsulating passivation layer;
a coating layer on the hard mask layer with the top surface of the metal pad exposed;
color filters formed on the coating layer over the passivation layer;
a planar transparent layer over the color filters; and
microlenses on the planar transparent layer over the color filters.

2. The system as claimed in claim 1 further comprising:
the passivation layer further comprises:
the encapsulating passivation layer encapsulating the metal pad with the top surface of the metal pad exposed.

3. The system as claimed in claim 1 further comprising:
a coating layer over the passivation layer;
the color filters further include:
a red color filter, a blue color filter, and a green color filter on the coating layer; and
the microlenses further comprise:
the microlenses on the coating layer over the red color filter, the blue color filter, and the green color filter.

4. The system as claimed in claim 1 further comprising:
the color filters over the planarized surface of the passivation layer;
the planar transparent layer on the color filters; and
the microlenses over the planar transparent layer over each of the color filters.

5. The system as claimed in claim 4 further comprising:
the passivation layer further comprises an encapsulating passivation layer on the substrate, the encapsulating passivation layer characterized in having a planar top surface.

6. The system as claimed in claim 4 further comprising:
the passivation layer further comprises an encapsulating passivation layer encapsulating the metal pad of a thickness of about 6,000 Å over the metal pad.

7. The system as claimed in claim 4 further comprising:
a coating layer of a bottom anti-reflective coating on the hard mask layer.

8. The system as claimed in claim 4 further comprising:
the color filters further includes a red color filter, a blue color filter, and a green color filter on the coating layer; and
the microlens further comprises the microlenses formed on the coating layer over the red color filter, the blue color filter, and the green color filter.

\* \* \* \* \*